United States Patent
Menczigar et al.

(10) Patent No.: US 7,372,331 B2
(45) Date of Patent: May 13, 2008

(54) RECEIVER CIRCUIT

(75) Inventors: Ulrich Menczigar, Vaterstetten (DE); Andreas Täuber, Unterschleissheim (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 11/357,905

(22) Filed: Feb. 17, 2006

(65) Prior Publication Data

US 2006/0209607 A1  Sep. 21, 2006

(30) Foreign Application Priority Data

Feb. 18, 2005  (DE) .................. 10 2005 007 579

(51) Int. Cl.
*H03F 3/45* (2006.01)
(52) U.S. Cl. .................. 330/261; 330/259; 327/108
(58) Field of Classification Search .............. 326/81, 326/83, 86, 112, 115, 121, 127; 327/108; 330/254, 258–261
See application file for complete search history.

(56) References Cited

U.S. PATENT DOCUMENTS

| | | |
|---|---|---|
| 5,283,482 A | 2/1994 | Chen |
| 5,736,871 A | 4/1998 | Goto |
| 6,294,932 B1 * | 9/2001 | Watarai ..................... 326/83 |
| 6,429,700 B1 * | 8/2002 | Yang ......................... 327/108 |
| 6,529,077 B1 * | 3/2003 | Dasgupta .................. 330/254 |
| 7,098,699 B2 * | 8/2006 | Tamura et al. ............ 327/108 |
| 7,202,714 B2 * | 4/2007 | Park .......................... 327/149 |

FOREIGN PATENT DOCUMENTS

| | | |
|---|---|---|
| EP | 1 011 196 A1 | 6/2000 |
| EP | 1 248 371 A1 | 10/2002 |
| EP | 1 548 943 A1 | 6/2004 |
| GB | 2 340 685 A | 2/2000 |

* cited by examiner

*Primary Examiner*—Vibol Tan
*Assistant Examiner*—Christopher Lo
(74) *Attorney, Agent, or Firm*—Maginot, Moore & Beck

(57) ABSTRACT

A receiver circuit for receiving and forwarding data signals comprises at least one first and one second input to be used to inject an external digital data signal and a reference signal into the receiver circuit, a multistage input amplifier circuit which comprises a first amplifier stage and a second amplifier stage connected downstream of the first amplifier stage, and a device for actively setting a first operating point of the multistage input amplifier circuit. The multistage input circuit provides the external digital data signal in amplified form at an output and the device generates a bias potential for driving the input multistage amplifier circuit on the basis of the circuit topography of the multistage input amplifier circuit. The bias potential is used to set a second operating point of the first amplifier stage in such a manner that its output signal is within a prescribed third operating point of the second amplifier stage.

13 Claims, 4 Drawing Sheets

RECEIVER CIRCUIT

BACKGROUND OF THE INVENTION

1. Field of the Invention

The invention relates to a receiver circuit for receiving and forwarding data signals.

2. Description of the Prior Art

Receiver circuits having integrated input amplifiers have been generally known for a relatively long time and are used for a wide diversity of circuit purposes and applications. Solely as regards the general background, reference shall be made to European patents EP 869 615 B1 and EP 869 614 B1 which each describe single-stage input amplifiers. Although applicable to any desired receiver circuit having input amplifiers, the present invention and the problem on which it is based are explained below with reference to input amplifiers for semiconductor memories.

There is increasingly a requirement, in modern computer and software applications, for ever larger quantities of data to be processed in an ever shorter period of time. Large-scale integrated memories, for example DRAM memories, are used to store the data. In order, then, to meet the requirement for an ever higher speed when processing data, it is necessary, in the case of such a semiconductor memory, for the data to be written to the memory and read out from said memory again in an appropriately rapid manner.

As development advances in the field of integrated circuits, the operating frequency thereof also rises, with the result that the data can be processed in an appropriately rapid manner. In addition, semiconductor memories which are specially designed for high data rates also exist. One representative of such a semiconductor memory is the so-called DDR-DRAM memory, where DDR stands for "double data rate". Whereas in conventional semiconductor memories write and read operations are performed only upon the rising edge or the falling edge of a clock signal, in DDR semiconductor memories data are read out from the semiconductor memory and are written to the semiconductor memory again both upon the rising edge and upon the falling edge of the clock signal. A double data rate is thus realized.

The data are read out from the semiconductor memory and are written to the semiconductor memory via an external interface which typically contains one or more input amplifiers. Since, on account of the high frequency, in particular, a very large quantity of data is read out or written via this interface, there is the particular requirement for these quantities of data to be shifted as effectively as possible, that is to say as optimally as possible in the available time windows. In this case, it is essential to comply with the so-called set-up and hold times which are defined, inter alia, by the maximum possible read-out speed and thus the efficiency when transferring data from and to the semiconductor memory.

DDR semiconductor memories and other applications use signals in which, together with the data signal, a reference potential is also simultaneously transmitted and injected into the input amplifier. FIG. 1 shows the timing for reading data into a known input amplifier, as is used, for example, to read in data from a DDR semiconductor memory.

V_EXT is used here to denote the data signal which is transferred to the DDR semiconductor memory, the voltage level of this external data signal V_EXT respectively being based on the reference potential V_REF which is concomitantly transmitted at the same time. The two signals V_EXT, V_REF represent the item of input data. The external data signal V_EXT is received, amplified and forwarded by the input amplifier circuit. In this case, the external switching point ES is defined as the point of intersection between the externally injected data signal V_EXT and the reference potential V_REF, the external switching point ES, by definition, being the same for a rising edge and a falling edge of the external data signal V_EXT. Forwarding and amplifying the external data signal V_EXT results in the internal data signal V_INT, the internal switching point IS1, IS2 resulting from the point of intersection between the internal data signal V_INT and an internal switching threshold V_IX which is typically defined by the circuit which is connected downstream of the input amplifier.

The problem with this is that, in the case of conventional input amplifier circuits such as the input amplifier described at the outset, the delay time for falling edges ($t_{pf}$) and rising edges ($t_{pr}$) of the data signal V_OUT is, inter alia, a function of the reference voltage V_REF and the operating point of the input amplifier. However, the reference voltage V_REF is typically subject to external fluctuations, for example fluctuations in the supply voltage and the temperature. In addition to external parameters such as the supply voltage and the temperature, the gain $A_v$ also depends, inter alia, on internal parameters, for example technology-dictated process fluctuations when fabricating the integrated input amplifier circuit. Without additional measures, this gives rise to different delay times $t_{pf}$, $t_{pr}$ which result in different respective internal switching thresholds IS1, IS2 for a falling edge and a rising edge of the internal data signal V_INT. This considerable dependence impairs the set-up and hold time for writing data.

This read-out operation is effected by latching the data, the data which are coded in the data signal being determined by changing the logic level from 0 to 1 and vice versa, that is to say by a falling or rising edge. By virtue of the fact that there are different signal propagation times (delay times) $t_{pf}$, $t_{pr}$ for a falling edge and a rising edge, a longer set-up and hold time thus also results overall, which directly results in the speed for writing the data decreasing if all of the transmitted data are to be read in reliably. In practice, this leads to significant impairment of the overall data processing efficiency since a worst case scenario for the set-up and hold time must be taken into account for reliably reading in and writing data, which overall, however, is at the expense of efficiency.

SUMMARY OF THE INVENTION

It is an object of the present invention to provide better timing and, in particular, bit-independent timing for processing data signals in an input amplifier.

The object is achieved in accordance with the invention by means of a receiver circuit for receiving and forwarding data signals, said circuit comprising at least one first and one second input which can be used to inject an external digital data signal and a reference signal into the receiver circuit, a multistage input amplifier circuit which contains a first amplifier stage and a second amplifier stage, which is connected downstream of the latter and provides the data signal in amplified form at an output, and a device for actively setting the operating point of the input amplifier circuit, which device, on the basis of the circuit topography of the input amplifier circuit, generates a bias potential for driving the input amplifier circuit, which potential can be used to set the operating point of the first amplifier stage in such a manner that its output signal is at a prescribed operating point of the second amplifier stage.

The idea on which the present invention is based is to use an apparatus to set the operating point of the first amplifier stage in such a manner that, when the external data signal matches the reference potential, that is to say at the instant of the external switching instant, the second amplifier stage drives a downstream circuit arrangement at its optimum operating point. This device is used to set the operating point of the two-stage input amplifier circuit in such a manner that the delay times are the same both for falling and for rising edges, which ultimately results in an identical internal switching point being ensured both for falling edges and for rising edges of the internal data signal. The delay times and thus also the internal switching point thus have no dependence, or have only minimal dependence, on the reference potential. The resulting set-up and hold times are thus optimal, which results, overall, in very effective data transfer and data processing, which ultimately optimizes efficiency.

The first amplifier stage may compare the data signal with the reference signal in order to generate, at the output, an internal data signal which can be fed to the second amplifier stage.

In a restricted version of the inventive circuit, the first amplifier stage is in the form of a level converter whose gain can be changed and, in particular, set using the bias potential. The level converter may be in the form of a differential amplifier, for example, which has a differential pair having a load which is preferably passive.

The second amplifier stage may be in the form of an inverter but, depending on the application, may also be designed differently as desired, for example in the form of an analogue amplifier.

The device for setting the operating point may have a regulating circuit containing a comparator circuit which compares a prescribed output potential of the second amplifier stage, which is operated at the operating point, with a prescribed reference potential, which is determined by the circuit topography of the input amplifier circuit, and generates the bias potential on the basis of said comparison. The comparator circuit is preferably in the form of a differential amplifier.

In a preferred implementation in which the second amplifier stage is in the form of an inverter, the reference potential corresponds to half the supply voltage. This operating point potential can be generated in a simple manner, for example using a voltage divider which has two identically dimensioned resistors. The magnitude or the value of this operating point potential is defined as a reference and depends, in particular, on the structure and circuit topography of the circuit parts connected downstream of the receiver circuit. In particular, this operating point potential is selected so as to match the intended circuit point of the downstream circuit elements.

In a further restricted version of the inventive circuit, the regulating circuit has a feedback path in which a replica of the second amplifier stage is arranged, a DC voltage potential whose value is a measure of the switching point of the second amplifier stage being fed to the input of said replica of the second amplifier stage. This switching point denotes the internal switching point at which the switching elements of the second amplifier stage switch on the basis of the internal data signal provided by the first amplifier stage.

A replica of the first amplifier stage may be provided in the feedback path of the regulating circuit for generating the DC voltage potential.

The first amplifier stage and/or the replica of the first amplifier stage respectively may have a controllable switch which can be driven using the bias potential and whose controlled path is arranged in series with the input circuit and the output circuit of the respective amplifier stage.

Provision may be made of an averager which uses a differential input signal to generate the reference signal which can be used to drive the replica of the first amplifier stage. Additionally or alternatively, provision may be made for an input signal and an input signal which is complementary to the latter to be applied to the first and second inputs of the first amplifier stage.

The input of the comparator circuit may be connected to an output of the replica of the first amplifier stage.

DESCRIPTION OF THE PREFERRED EMBODIMENTS

Figure 1:
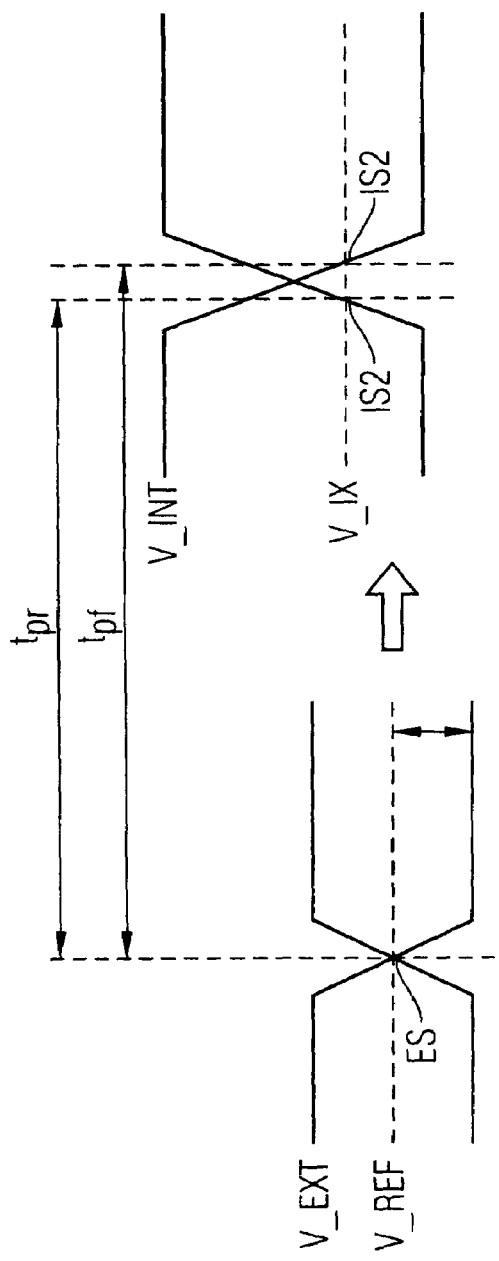
FIG. 1 as described above, is the timing for reading data into a known input amplifier.

In the figures of the drawing, unless specified otherwise, identical and functionally identical elements and signals have been provided with the same reference symbols.

Figure 2:
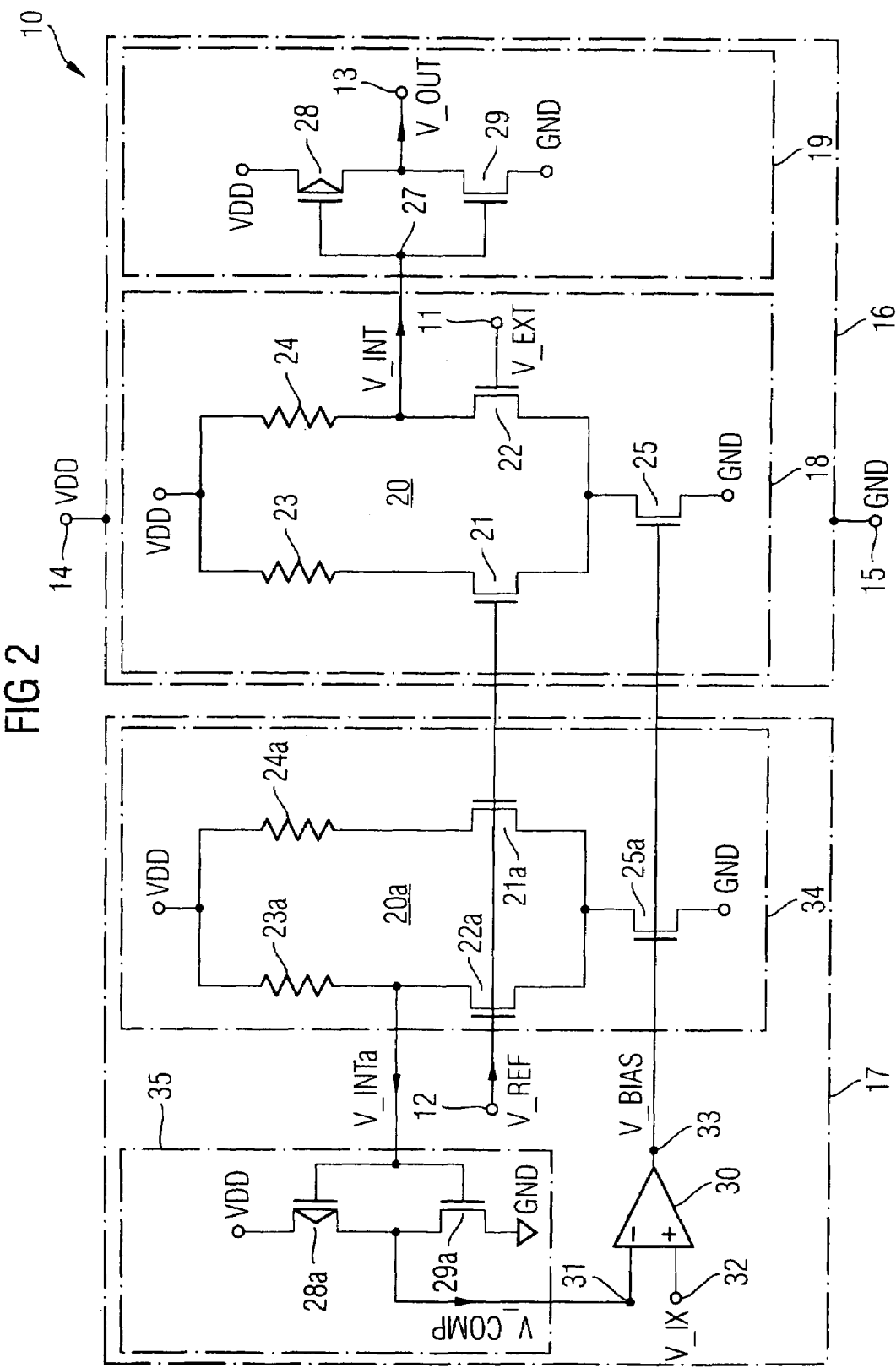
FIG. 2 is the circuit diagram of an inventive receiver circuit.

FIG. 2 shows the circuit diagram of an inventive receiver circuit which is denoted using reference symbol 10. The receiver circuit 10 has a data input 11, a reference input 12 and a data output 13.

An external data signal V_EXT can be injected into the receiver circuit 10 via the data input 11. This data signal V_EXT may be any desired data signal containing a binary digital item of data from any data source. By way of example, this data signal V_EXT may have been generated by a processor or read out from a memory.

A reference potential V_REF can be injected into the receiver circuit 10 via the reference input 12. This reference potential V_REF may be provided by an external voltage source (which is specifically provided for this purpose) or may be generated within a semiconductor memory. The reference potential V_REF thus represents a comparison potential whose reference is used to transfer the data contained in the data signal V_EXT and whose reference is used to specify the timing for transferring data. This reference potential V_REF and thus, in an associated manner, the timing for transferring data are typically prescribed in a specification for a semiconductor memory or any desired data transmission system. In contrast to the data signal V_EXT, the reference potential V_REF is more or less constant but is typically subject to external fluctuations, for example fluctuations in the supply voltage VDD, GND and the temperature.

An amplified output signal V_OUT which is derived from the external data signal V_EXT is applied to the data output 13 for further processing by downstream circuit parts.

The receiver circuit 10 has two supply terminals 14, 15 which are used to supply power to the receiver circuit 10. In this case, a first supply potential VDD, for example a positive potential VDD, is applied to the first supply input 14, while a second supply potential GND, for example the reference-earth potential GND, is applied to the second supply input 15.

The receiver circuit 10 comprises an input amplifier circuit 16 and a device 17 for setting the operating point, which device is connected upstream of the input amplifier 16 and is used to actively set the operating point.

In the present exemplary embodiment, the input amplifier circuit 16 is of two-stage design and contains a first amplifier stage 18 and a second amplifier stage 19. In the present exemplary embodiment, the first amplifier stage 18 is in the form of a level converter. The second amplifier stage 19 which is connected downstream of the first amplifier stage 18 is in the form of an inverter. The level converter of the first amplifier stage 18 is formed by a differential amplifier 20 having a passive load. This differential amplifier 20 thus contains two transistors 21, 22 whose respective controlled paths are arranged in series with a respective resistor 23, 24, the series circuits formed in this manner being arranged parallel to one another. Provision is also made of a further transistor 25 whose controlled path is arranged between the second supply terminal 15 and the differential amplifier 20. In this case, the transistor 25 is driven using a bias potential V_BIAS.

The first transistor 21 of the differential amplifier is controlled using the reference potential V_REF, whereas the second transistor 22 is controlled using the external data signal V_EXT. The centre tap between the second transistor 22 and the corresponding resistor 24 forms the output 2.6 of the first amplifier stage 18, to which the internally amplified data signal V_INT is thus applied. The internally amplified data signal V_INT thus corresponds to the voltage drop across the resistor 24.

This internally amplified data signal V_INT is fed to the inverter of the second amplifier stage 19. The inverter has, in a known manner, two transistors 28, 29 whose controlled paths are arranged in series with one another and between the first and second supply terminals 14, 15. On the control side, these transistors 28, 29 are connected to the input 27 of the inverter, with the result that the transistors 28, 29 are controlled using the internally amplified data signal V_INT. A tap between the controlled paths of the transistors 28, 29 forms the output of the inverter and, as it were, the data output 13 of the receiver 10.

In the present exemplary embodiment, all of the transistors 21, 22, 25, 28, 29 are in the form of MOSFETs.

The device 17 for setting the operating point contains a comparator circuit 30 which is in the form of a differential amplifier. The differential amplifier 30 has differential inputs 31, 32 and an output 33. A regulating signal V_COMP can be injected into the differential amplifier 30 via the input 31, and an operating point signal V_IX for defining a defined operating point can be injected into the differential amplifier 30 via the input 32. Comparing these two signals V_COMP, V_IX results in a differential signal which is provided at the output 33 in the form of a bias potential V_BIAS. This bias potential V_BIAS can be used to control the transistor 25 of the first amplifier stage 18.

In order to obtain the bias potential V_BIAS, the device 17 has a regulating circuit. In addition to the differential amplifier 30, this regulating circuit comprises a feedback path in which so-called replicas 34, 35 of the first and second amplifier stages 18, 19 of the input amplifier circuit 16 are arranged. These circuit parts 34, 35 were fabricated under virtually the same process and technology parameters as the circuit parts 18, 19, with the result that they also exhibit identical properties in the event of fluctuations in the external parameters such as the temperature or the supply voltage. The inventive idea is now to simulate the manner in which these circuit parts 34, 35 operate under operating conditions and to derive, from this knowledge, an optimum operating point for the actual amplifier stages 18, 19.

The letter "a" is additionally used below, in addition to the relevant number, to denote those elements of the circuits 34, 35 which correspond to the corresponding elements of the first and second amplifier stages 18, 19.

The replica 34 of the first amplifier stage 18 thus comprises, in the same way, a differential amplifier 20a and a transistor 25a which is arranged in series with the latter and is driven using the bias potential V_BIAS. In contrast to the first amplifier stage 18, however, the two transistors 21a, 22a of the differential amplifier 20a are driven using the same reference potential V_REF. Specifically, the following always applies in this case: V_EXT=V_REF. The circuit 34 representing the first amplifier stage 18 is thus operated as if the circuit 35 representing the second amplifier stage 19 were just about to switch. In this manner, a comparison signal V_COMP is generated at the output of the inverter and is fed to the differential amplifier 30 as a regulating signal.

Figure 3:
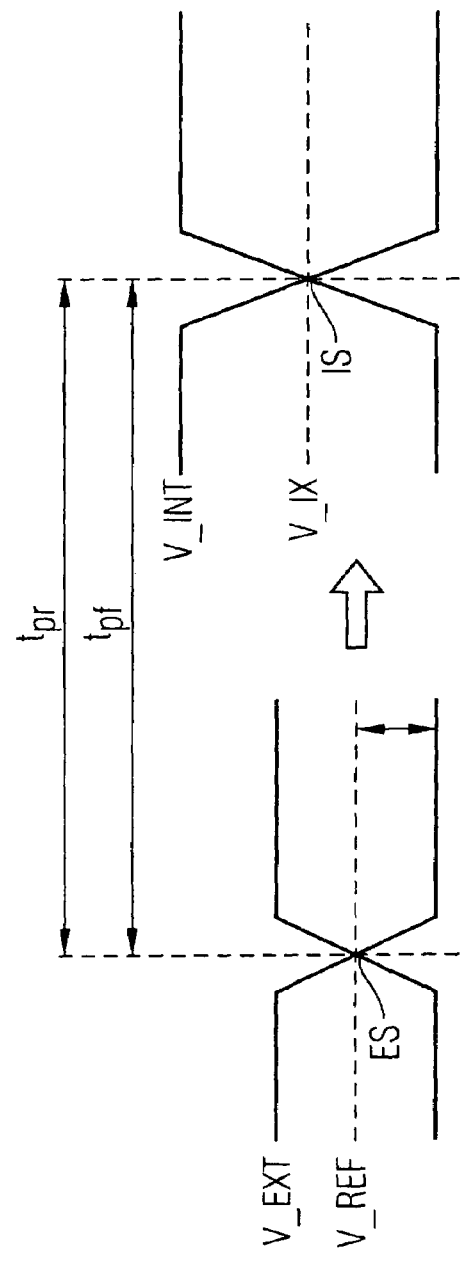
FIG. 3 is the timing for the inventive receiver circuit of FIG. 2.

The regulating circuit is thus used to generate a bias potential V_BIAS which already contains an item of information about the optimum switching instant of the second amplifier stage 19. If this bias potential V_BIAS is injected into the transistor 25 of the first amplifier stage 18, it is possible to ensure, since the circuit parts 34, 35 correspond almost exactly to the corresponding amplifier stages 18, 19, that the second amplifier stage 19 is operated at its optimum operating point and thus at the desired switching point. A data output signal V_OUT which ensures that downstream [lacuna] are likewise operated at their optimum switching point is thus provided at the output 13 of the second amplifier stage 19. This ensures, in particular, that the delay times $t_{pr}$, $t_{pf}$ are the same, with the result that the points of intersection IS between the falling and rising edges of the internally amplified data signal V_INT coincide with the prescribed potential V_IX for defining the operating point (see FIG. 3).

In an additional functionality, this potential V_IX which is used to set the operating point of the second amplifier stage 19 may be respectively matched to the circuit topographies of the different circuit parts. This makes it possible, in particular, for the inventive receiver circuit 10 to be matched to any desired downstream circuit arrangements and nevertheless to ensure that the internally amplified data signal V_OUT which is fed to the latter already has an optimum operating point, that is to say the delay times $t_{pr}$, $t_{pf}$ are identical to a very large extent.

Figure 5:
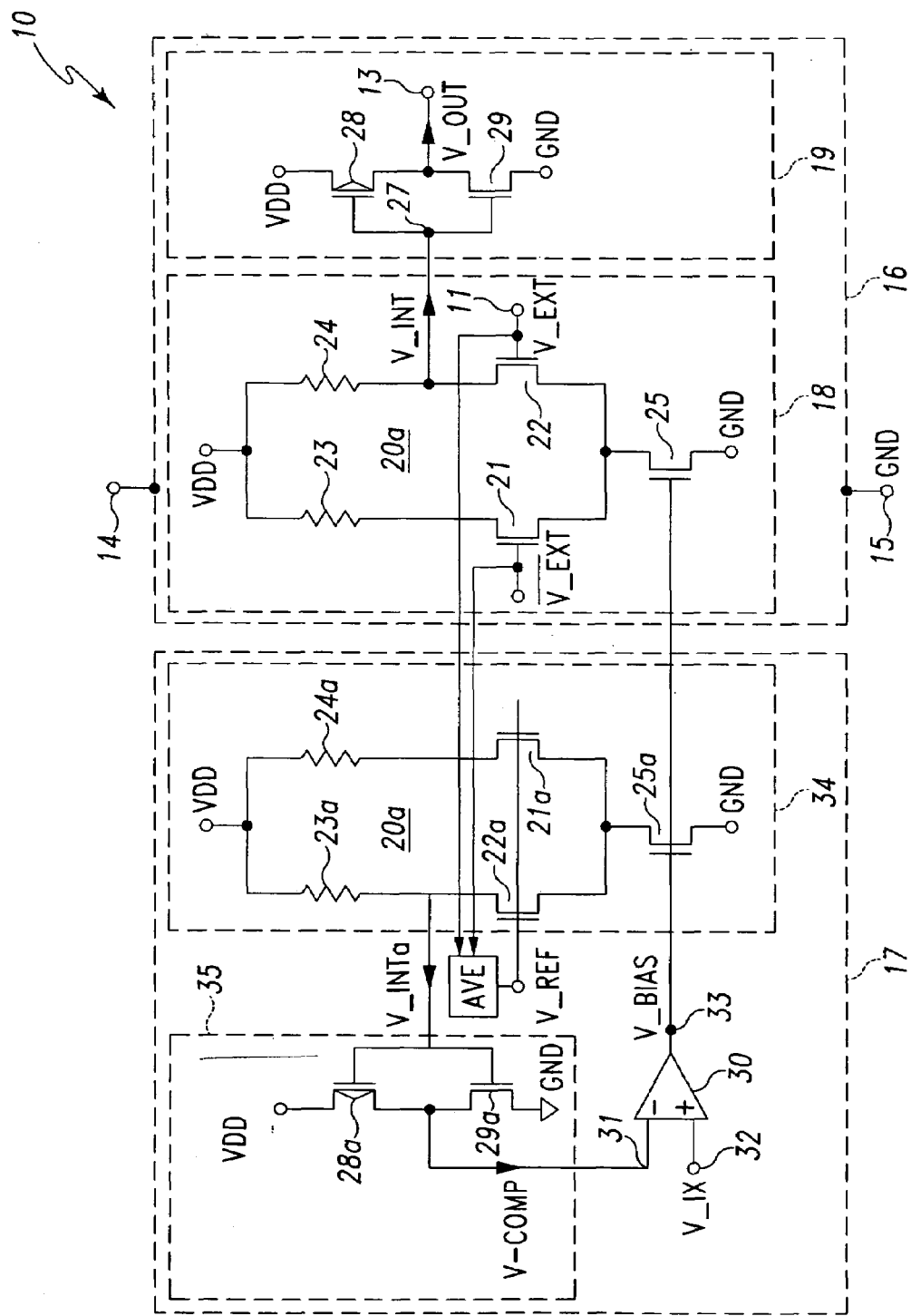
FIG. 5 is an alternative embodiment of the receiver circuit of FIG. 2

In a development relating to FIG. 2. which is illustrated in FIG. 5, the signal V—REF for the replica 34 of the differential amplifier 20a of the first amplifier stage 18 is generated from a differential input signal using an averager. At the same time, the differential signal includes one input signal V_EXT which is connected to transistor 22 via the input 11 and an input signal which is complementary to said input signal which is connected to transistor 21 of the differential amplifier 20.

In this refinement, it may be expedient for the positive input 32 (to which the reference potential V_IX is applied in the example in FIG. 2) of the differential amplifier 30 to now be connected to the output of the replica 34 of the differential amplifier 20a so that the potential V_INTa is fed to the positive input 32 of the differential amplifier 30.

Figure 4:
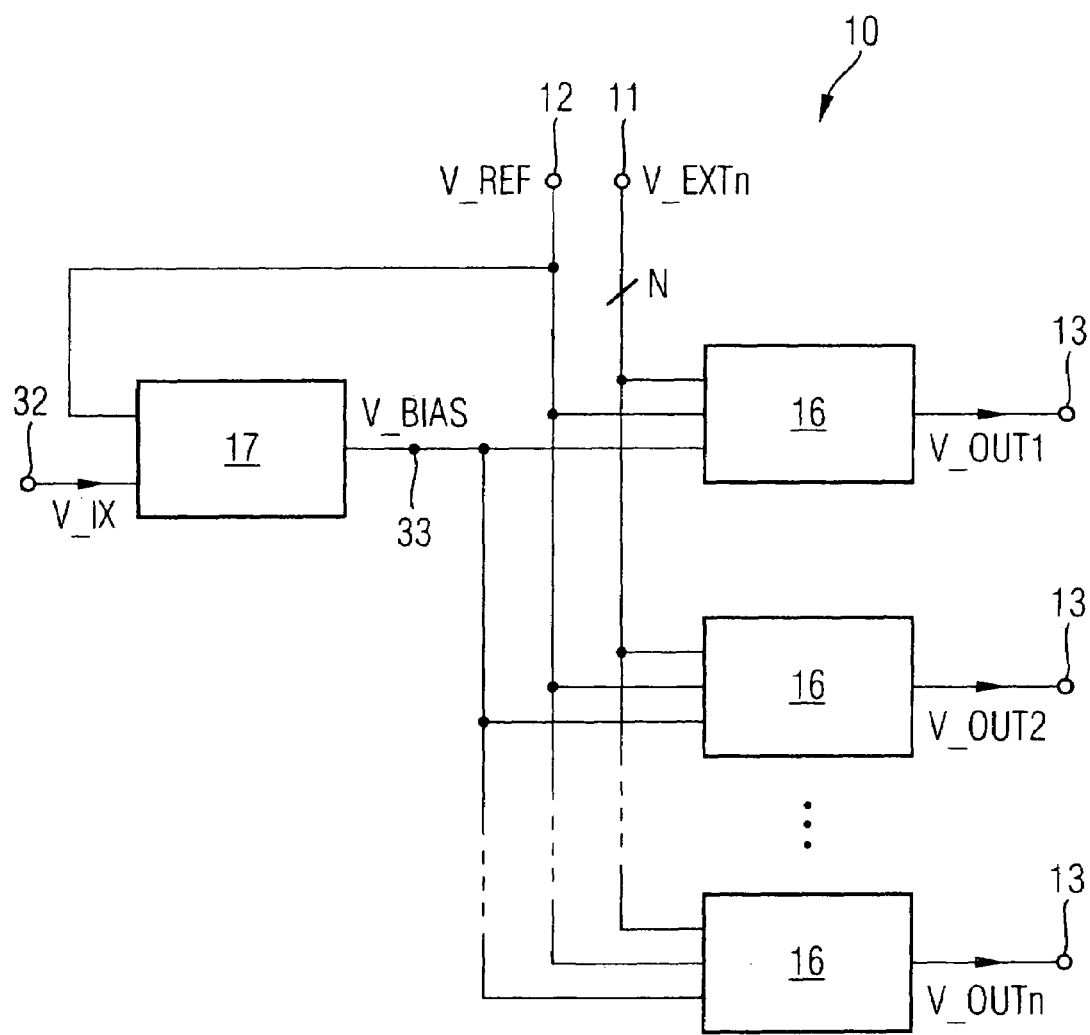
FIG. 4 is a block diagram for illustrating a particularly preferred exemplary embodiment of an inventive receiver circuit.

FIG. 4 shows, merely diagrammatically, a block diagram for illustrating a particularly preferred exemplary embodiment of an inventive receiver circuit which is designed, in this case, for use in a large-scale integrated semiconductor circuit. In contrast to the general illustration of the receiver circuit in FIG. 2, the receiver circuit 10 in FIG. 4 has a plurality of input amplifiers 16 which are preferably of identical design and are arranged parallel to one another via their inputs and outputs. The particular advantage of this receiver circuit 10 now resides in the fact that only one single device 17 for setting the operating point is provided, which device is associated with all n input amplifiers 16 and in which only one single bias potential V_BIAS is thus needed to drive all of the input amplifier circuits 16. In the specific case of a very complex semiconductor memory, the latter may have a multiplicity of input amplifiers 16, for example 10 to 100, which have, however, only one single device 17 for setting the operating point connected upstream of them. This makes it possible to implement the inventive functionality, in terms of circuitry, in a very simple but nevertheless very effective manner.

In the present case, the same reference symbol 16 was used to denote all of the input amplifiers, which is intended to indicate that they are identical to a very large extent; however, it goes without saying that they could also be configured differently.

In the example in FIG. 4, only one line was illustrated between the inputs 11 and the various input amplifiers 16. It goes without saying that each input amplifier 16 is associated with a respective individual input, to which a different signal V_EXT1-V_EXTn can be respectively applied, and with a connecting line which is arranged in between, which was illustrated in FIG. 4 using the reference symbol N.

Although the present invention was described in more detail above with reference to a preferred exemplary embodiment, it shall not be restricted thereto but rather can be modified in various ways. Therefore, the invention shall not necessarily be restricted to a two-stage input amplifier; rather, it goes without saying that it may also be applied to amplifier circuits having more than two stages. Furthermore, the invention shall not be restricted to use in a semiconductor memory either.

In addition, the invention is not restricted, in particular, to the circuit arrangements specifically explained with reference to FIGS. 2 and 4. Rather, said figures merely illustrate preferred exemplary embodiments which, of course, may be modified as desired by varying the circuit parts and circuit elements without departing from the fundamental principle of the invention. In particular, the passive elements (resistors), for example, may also be implemented in the form of inductive, capacitive or else active elements. In addition, the transistors need not necessarily be in the form of MOSFETs but rather may also be implemented using bipolar technology. Furthermore, the inverter representing the second amplifier stage is merely a specific exemplary embodiment but may be altered using any other desired circuit parts corresponding to the downstream circuit arrangements.

Although modifications and changes may be suggested to those skilled in the art, it is the intention of the inventors to embody within the patent warranted hereon all changes and modifications as reasonably and properly come within the scope of their contribution to the art.

We claim as our invention:

1. A receiver circuit for receiving and forwarding data signals, comprising:
   at least one first and one second input to be used to inject an external digital data signal and a reference signal into said receiver circuit;
   a multistage input amplifier circuit which comprises a first amplifier stage and a second amplifier stage connected downstream of said first amplifier stage; said multistage input circuit providing said external digital data signal in amplified form at an output; and
   a device for actively setting a first operating point of said multistage input amplifier circuit; said device generating a bias potential for driving said multistage input amplifier circuit on the basis of the circuit topography of said multistage input amplifier circuit; said bias potential being used to set a second operating point of said first amplifier stage in such a manner that its output signal is within a prescribed third operating point of said second amplifier stage, said device comprising a regulating circuit, the regulating circuit comprising a feedback path comprising said first replica of said second amplifier stage and a DC voltage potential whose value is a measure of the switching instant of said second amplifier stage being fed to an input of said first replica.

2. The circuit of claim 1, wherein said first amplifier stage compares said external digital data signal with said reference signal in order to generate at its output an internal data signal fed to said second amplifier stage.

3. The circuit of claim 1, wherein said first amplifier stage is a level converter whose gain is set using said bias potential.

4. The circuit of claim 1, wherein said second amplifier stage is an inverter.

5. The circuit of claim 1, wherein said regulating circuit comprising a comparator circuit which compares a prescribed output potential of said second amplifier stage operating at said third operating point with a prescribed reference potential determined in accordance with said circuit topography of said multistage input amplifier circuit; said comparator generating said bias potential on the basis of said comparison.

6. The circuit of claim 5, wherein said comparator circuit is a differential amplifier.

7. The circuit of claim 5, wherein said second amplifier stage is an inverter and said reference potential corresponds to half a supply voltage of said receiver circuit.

8. The circuit of claim 1, comprising a second replica of said first amplifier stage; said feedback path comprising said second replica.

9. The circuit of claim 1, wherein said first amplifier stage comprises a controllable switch controlled by said bias potential and whose controlled path is arranged in series with an input circuit and an output circuit of said first amplifier stage.

10. The circuit of claim 8, wherein second replica comprises a controllable switch controlled by said bias potential and whose controlled path is arranged in series with an input circuit and an output circuit of said second replica.

11. The circuit of claim 8, comprising an averager which uses a differential input signal to generate said reference signal to be used to drive said second replica.

12. The circuit of claim 8, wherein said first amplifier stage comprises a first input and a second input and an input signal is applied to said first input and a signal complementary to said input signal is applied to said second input.

13. The circuit of claim 8, wherein the input of said comparator circuit is connected to an output of said second replica.

* * * * *